(12) United States Patent
Kolmhofer

(10) Patent No.: US 7,773,026 B2
(45) Date of Patent: Aug. 10, 2010

(54) HETERODYNE TRANSCEIVER SYSTEMS AND METHODS

(75) Inventor: Erich Kolmhofer, Linz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/184,477

(22) Filed: Aug. 1, 2008

(65) Prior Publication Data

US 2010/0026564 A1 Feb. 4, 2010

(51) Int. Cl.
*G01S 13/00* (2006.01)

(52) U.S. Cl. .......................... 342/74; 455/88; 342/128; 342/132

(58) Field of Classification Search .................. 342/103
See application file for complete search history.

(56) References Cited

U.S. PATENT DOCUMENTS

| 4,709,237 A | 11/1987 | Poullain et al. |
| 5,150,078 A | 9/1992 | Yang et al. |
| 5,761,259 A * | 6/1998 | Dingsor ...................... 375/285 |
| 6,169,912 B1 * | 1/2001 | Zuckerman .................. 455/570 |
| 6,373,344 B1 | 4/2002 | Mar |
| 6,950,478 B1 * | 9/2005 | Rothenberg ................. 375/295 |
| 7,203,466 B2 * | 4/2007 | Muschallik et al. ........... 455/86 |
| 7,508,277 B2 * | 3/2009 | Kuo et al. ...................... 331/25 |
| 2005/0206458 A1 * | 9/2005 | Wu ............................. 331/1 A |
| 2006/0211390 A1 * | 9/2006 | Uozumi et al. ........... 455/180.3 |
| 2008/0136535 A1 * | 6/2008 | Khorram ..................... 331/17 |

FOREIGN PATENT DOCUMENTS

EP 0 789 252 A1 8/1997

* cited by examiner

*Primary Examiner*—Thomas H Tarcza
*Assistant Examiner*—Timothy A Brainard
(74) *Attorney, Agent, or Firm*—Eschweiler & Associates, LLC

(57) ABSTRACT

One embodiment relates to a transceiver. The transceiver includes first and second phase-locked loops. The first phase-locked loop is adapted to receive a reference signal and output a transmission signal based on the reference signal. The second phase-locked loop is adapted to receive the reference signal and output a local oscillator (LO) signal based on the reference signal. The frequency of the LO signal is shifted relative to the frequency of the transmission signal. Other methods and systems are also disclosed.

17 Claims, 6 Drawing Sheets

HETERODYNE TRANSCEIVER SYSTEMS AND METHODS

FIELD OF DISCLOSURE

The present disclosure relates generally to radar and communication systems, and more particularly to heterodyne transceivers.

BACKGROUND

Electronic radar and communication devices are becoming more integrated in today's society. These radar and communication devices often rely on transceivers (i.e., transmitters and receivers) that enable a given device to take remote measurements or communicate with another device. Due to the increasing demand for more efficient radar and communication systems, improvements in transceivers are a valuable contribution to the marketplace.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a transceiver. The transceiver includes first and second phase-locked loops. The first phase-locked loop is adapted to receive a reference signal and output a transmission signal based on the reference signal. The second phase-locked loop is adapted to receive the reference signal and output a local oscillator (LO) signal based on the reference signal. The frequency of the LO signal is shifted relative to the frequency of the transmission signal. Other methods and systems are also disclosed.

The following description and annexed drawings set forth in detail certain illustrative aspects and implementations of the invention. These are indicative of only a few of the various ways in which the principles of the invention may be employed.

DETAILED DESCRIPTION

Figure 1:
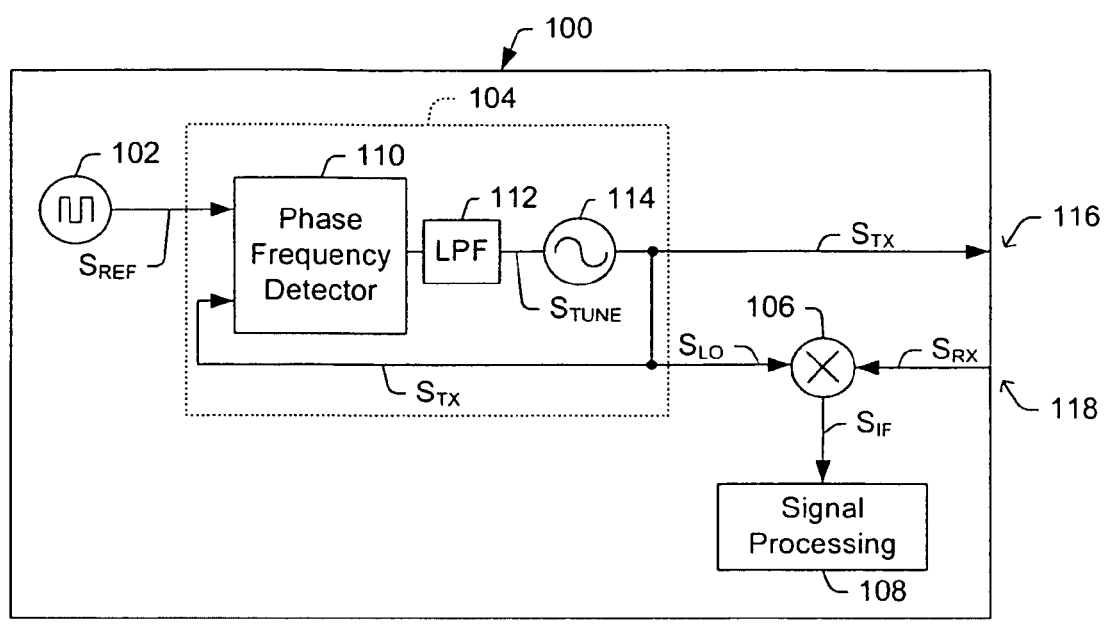
FIG. 1 shows a homodyne transceiver that includes a single phase-locked loop and suffers from some shortcomings.

One or more implementations of the present invention will now be described with reference to the attached drawings, wherein like reference numerals are used to refer to like elements throughout. Nothing in this specification is admitted as prior art.

FIG. 1 shows an embodiment of a homodyne transceiver 100. The transceiver includes a reference generator 102, a single phase-locked loop (PLL) 104, a receiver mixer 106, and signal processing circuitry 108. The PLL 104 includes phase frequency detector 110, a low pass filter 112, and a variable electronic oscillator 114. The PLL 104 generates a transmission signal $S_{TX}$ that is provided to a transmit antenna port 116. In addition, the transmission signal $S_{TX}$ is also used as a local oscillator (LO) signal $S_{LO}$. The receiver mixer 106 uses $S_{LO}$ to down-convert a radio frequency (RF) signal, $S_{RX}$, received from a receive antenna port 118.

More specifically, during operation the reference generator 102 generates a reference signal, $S_{REF}$. The phase frequency detector 110 compares $S_{REF}$ to the transmission signal, $S_{TX}$, provided on a feedback path of the PLL 104. The result of this comparison is filtered to generate a tuning signal $S_{TUNE}$, which conveys the phase and/or frequency difference between the reference signal $S_{REF}$ and transmission signal $S_{TX}$. Thus, if the phase of the transmission signal $S_{TX}$ falls behind that of the reference signal $S_{REF}$, the phase frequency detector 110 changes the tuning signal $S_{TUNE}$ to increase the frequency of the variable electronic oscillator 114. Conversely, if the phase of the transmission signal $S_{TX}$ gets ahead of the reference signal $S_{REF}$, the phase frequency detector 110 changes the tuning signal $S_{TUNE}$ to decrease the frequency of the variable electronic oscillator 114. In this way, the PLL 104 can quickly "lock" the transmission signal $S_{TX}$ to the reference signal $S_{REF}$, thereby providing a clean replica of the reference signal $S_{REF}$.

While this homodyne transceiver 100 is suitable for some radar and communication systems, the inventors have appreciated that because the transmission signal $S_{TX}$ (and equivalently $S_{LO}$) has approximately the same frequency as the received signal $S_{RX}$, the receiver mixer 106 generates an intermediate frequency (IF) signal $S_{IF}$ that is relatively low. Because the intrinsic noise of the receiver mixer 106 increases as the IF frequency decreases, and because DC components may be superimposed on $S_{IF}$, it becomes difficult to accurately process $S_{IF}$.

Figure 2:
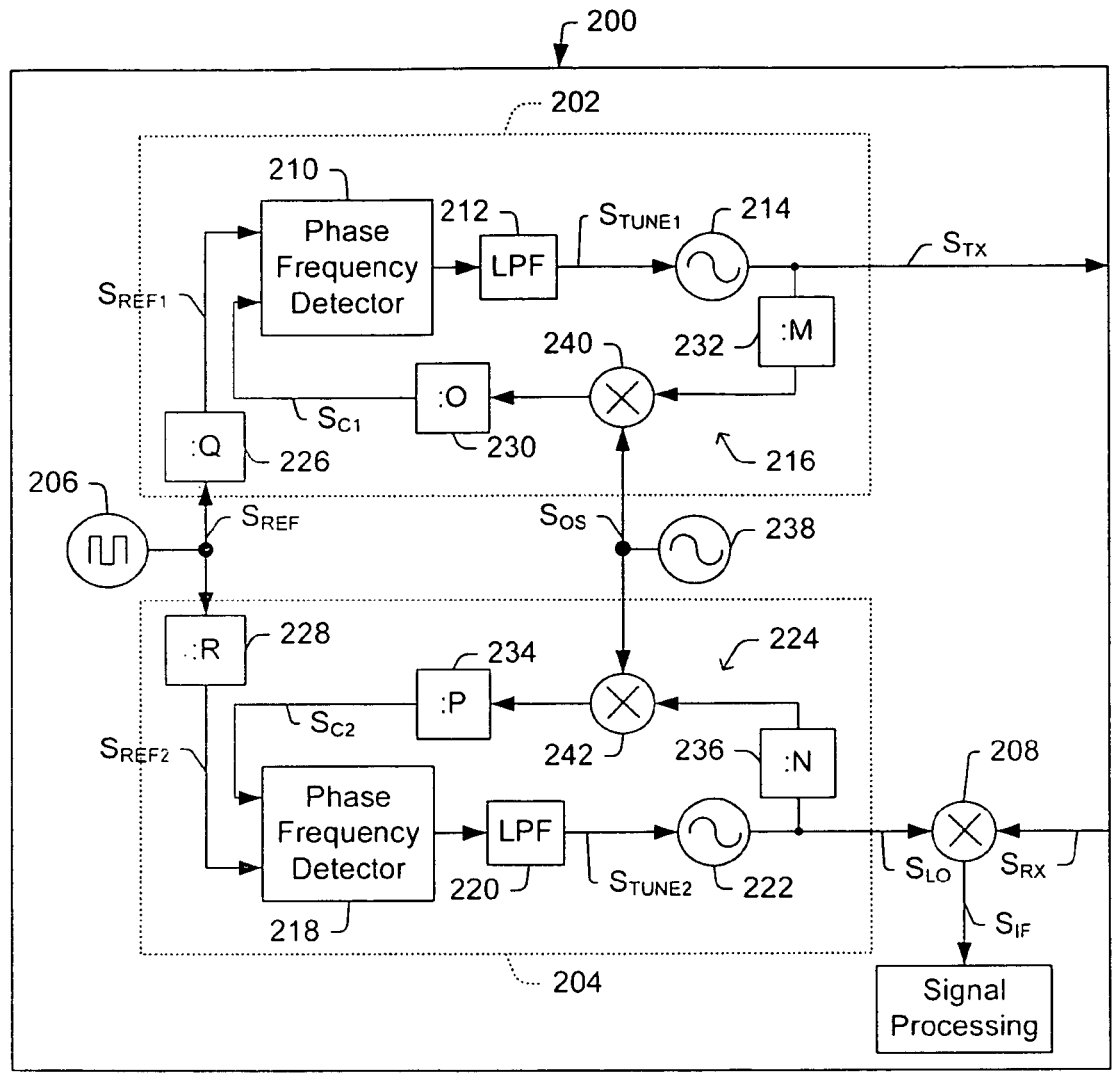
FIG. 2 shows a heterodyne transceiver that includes first and second phase-locked loops in accordance with one embodiment of the present invention.

To remedy this deficiency, the inventors have fashioned advantageous heterodyne transceivers that introduce a frequency offset between $S_{TX}$ and $S_{LO}$. FIG. 2 shows one embodiment of a heterodyne transceiver 200 that includes a first PLL 202 and a second PLL 204. The first and second PLLs 202, 204 are adapted to receive a reference signal $S_{REF}$ from a reference generator 206. Based on $S_{REF}$, the first PLL 202 outputs a transmission signal $S_{TX}$, and the second PLL 204 outputs a local oscillator (LO) signal, $S_{LO}$. The frequency of $S_{LO}$ is shifted relative to the frequency of $S_{TX}$. Thus, when a receiver mixer 208 mixes $S_{LO}$ with a received radio frequency signal $S_{RX}$, this shift causes the frequency of the IF signal, $S_{IF}$, to be increased relative to the previously discussed homodyne transceiver 100. Thus, this architecture can reduce the impact of noise and allow more reliable detection or communication.

To achieve this functionality, the first PLL 202 includes a first phase frequency detector 210, a first low pass filter 212, a first variable electronic oscillator 214, and a first feedback path 216. Somewhat similarly, the second PLL 204 includes a second phase frequency detector 218, a second low pass filter 220, a second variable electronic oscillator 222, and a second feedback path 224. The first and second PLLs 202, 204 may also include first and second frequency dividers 226, 228 to divide the reference frequency $S_{REF}$, thereby providing first and second reference signals $S_{REF1}$, $S_{REF2}$, respectively. The first and second frequency dividers 226, 228 may have the same or different values.

In many embodiments, other frequency dividers (e.g., 230, 232, 234, 236) are arranged on the first and second feedback paths 216, 224 or at other positions in the transceiver 200 to facilitate the desired frequency shift between $S_{TX}$ and $S_{LO}$. In addition, a frequency offset generator 238 often provides a frequency offset signal $S_{OS}$ to first and second mixers 240, 242, respectively along the first and second feedback paths 216, 224. This frequency offset signal $S_{OS}$ may also help facilitate the desired frequency shift.

In this arrangement, the first and second variable electronic oscillators 214, 222 can be modulated in common by changing the frequency of $S_{REF}$ and/or by changing the frequency $S_{OS}$. Thus, the transmission signal, $S_{TX}$, has a frequency, $f_{TX}$, represented by:

$$f_{tx} = M \cdot f_{OS} \pm \frac{M \cdot O}{Q} \cdot f_{ref},$$

and the LO signal, $S_{LO}$, has a frequency, $f_{LO}$, represented by:

$$f_{LO} = N \cdot f_{OS} \pm \frac{N \cdot P}{R} \cdot f_{ref},$$

where M, N, O, P, Q, and R can either be integers or non-integers associated with the respective frequency dividers as shown. Note that these formulas (i.e., with the "plus or minus" signs) account for the possibility that the first and second mixers 240, 242 can be operated in their upper or lower sidebands. Thus, the LO frequency can be higher or lower than the transmitted frequency, depending on the implementation. Therefore, the frequency shift between $S_{TX}$ and $S_{LO}$ becomes:

$$f_{LO} - f_{TX} = f_{ref} \cdot \left( \pm \frac{N \cdot P}{R} \mp \frac{M \cdot O}{Q} \right) + f_{OS} \cdot (N - M).$$

In one embodiment, M=N, which causes the frequency shift to be:

$$f_{LO} - f_{TX} = f_{ref} \cdot N \cdot \left( \pm \frac{P}{R} \mp \frac{O}{Q} \right),$$

which is independent of $f_{OS}$. Thus, the system can be modulated by changing $f_{OS}$ without causing a change in the frequency shift between $S_{TX}$ and $S_{LO}$.

Depending on the implementation, $S_{TX}$ and $S_{RX}$ can be provided to a common antenna via a diplexer, or can be provided to separate transmit and receive antennas.

Figure 3:
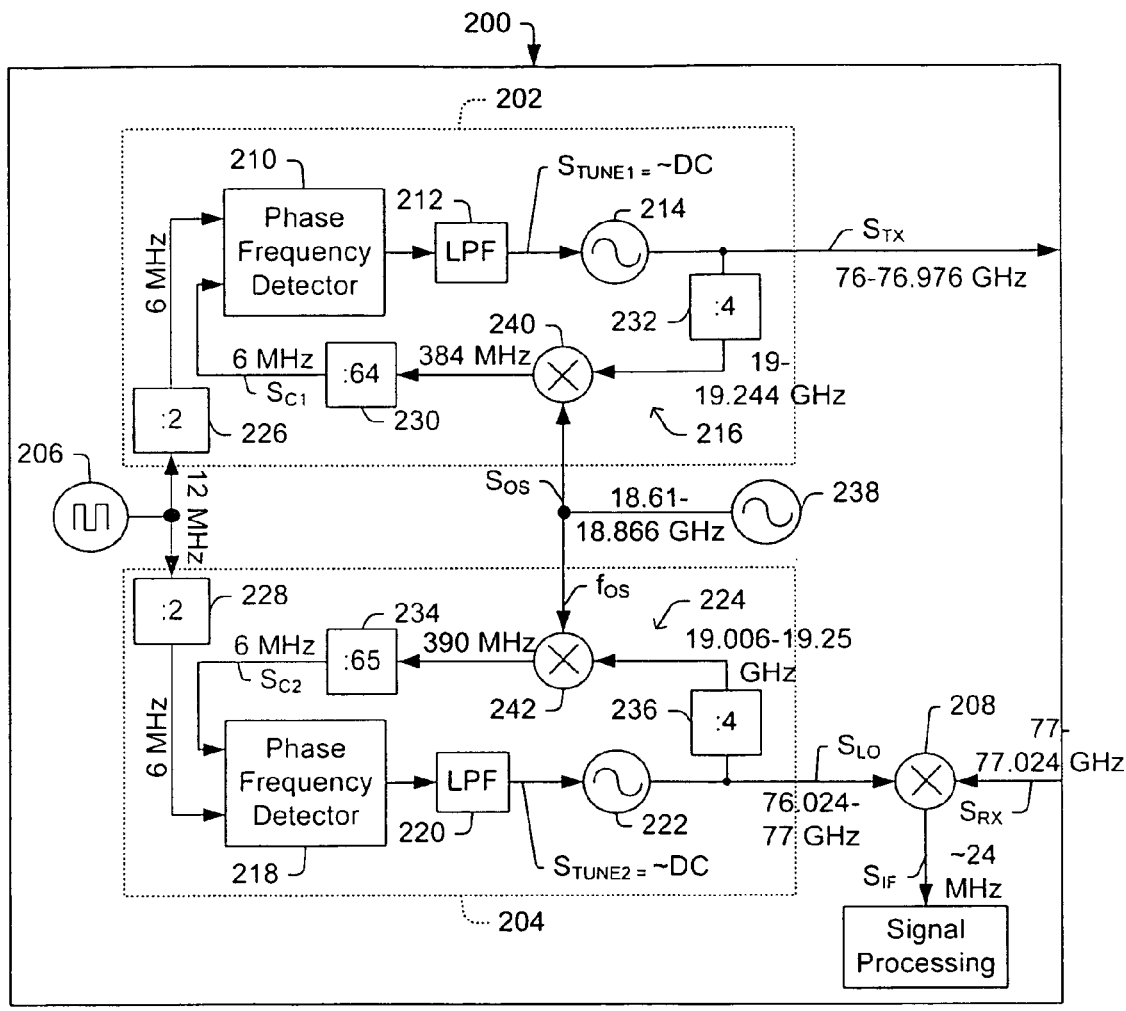
FIG. 3 shows a more detailed implementation of FIG. 2's heterodyne transceiver with illustrative frequencies superimposed thereon.

A more specific example will now be discussed with reference to FIG. 3, which shows an example of a particular implementation that is well-suited for some radar applications. The frequencies superimposed on FIG. 3 are included to provide one example for purposes of clarity, and are not limiting in any way. As one of ordinary skill in the art appreciates, practically any frequency range could be used at the various nodes of the transceiver, and practically any values for the frequency dividers can be used.

During operation, the reference generator 206, which may be a crystal oscillator in one embodiment, generates a reference frequency of approximately 12 MHz.

The first and second frequency dividers 226, 228 (which have values of Q=R=2 in this embodiment) divide the 12 MHz reference frequency into first and second reference signals having frequencies of 6 MHz.

The first phase frequency detector 210 can change a first tuning signal $S_{TUNE1}$ provided to the first variable electronic oscillator 214 until the first correction signal $S_{C1}$ is phase-locked to the first reference signal $S_{REF1}$ (i.e., in this example, the first phase frequency detector 210 locks $S_{C1}$ to 6 MHz). Assuming there is little frequency drift, $S_{TUNE1}$ have a frequency of approximately zero Hz (i.e., DC).

Notably, even though $S_{C1}$ is "locked" to 6 MHz, the first variable electronic oscillator 214 is actually providing a much higher output frequency for $S_{TX}$ (i.e., $f_{TX}$ ranges from 76 to 76.976 GHz). In essence, the frequency dividers 230, 232 and first mixer 240 "fool" the first phase frequency detector 210 into ramping the frequency of the first variable electronic oscillator 214 to a much higher frequency than $S_{C1}$.

Thus, on the first feedback path 216, the frequency divider 232 (which has a value of M=4), divides $f_{TX}$ by 4 and provides a frequency of 19-19.244 GHz to the first mixer 240. The first mixer 240 mixes this frequency of 19-19.244 GHz with the offset frequency signal $S_{OS}$ of 18.61-18.866 GHz to obtain a mixed frequency of 384 MHz. The frequency divider 230 (which has a value of O=64), then divides the frequency of 384 MHz down to 6 MHz, thereby completing the phase-lock procedure.

Somewhat similar functionality is also shown for the second PLL 204. Notably, however, the frequency divider 234 on the second feedback path 224 has a different value from the frequency divider 230 on the first feedback path 216, thereby inducing the desired frequency shift between the $S_{TX}$ and $S_{LO}$. More specifically, in this embodiment of frequency shift of approximately 24 MHz is established (i.e., $f_{TX}$-$f_{LO}$=76 GHz–76.024 GHz, or $f_{TX}$-$f_{LO}$=76.976 GHz–77 GHz). Again, other arrangements could also establish this or other desired frequency shifts.

It will be appreciated that the above described transceivers can be implemented using analog or digital PLLs. Depending on the implementation, the output frequencies of such PLLs can range, for example, from a fraction of a cycle per second up to many gigahertz.

Figure 4:
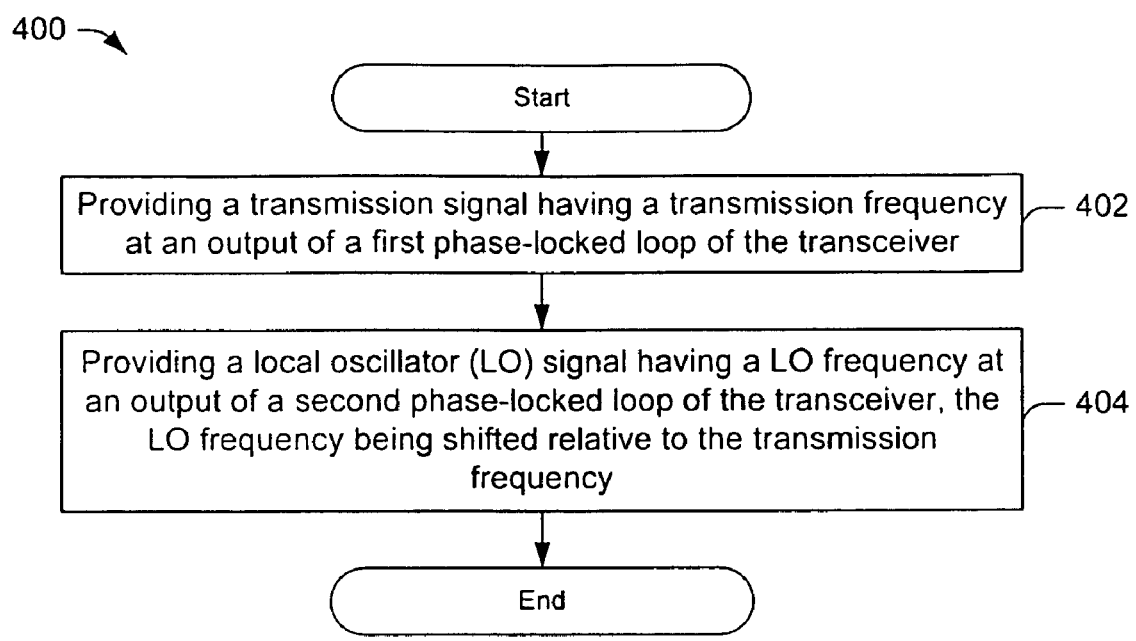
FIG. 4 shows a flowchart illustrating a method of signal processing according to one embodiment of the present invention.
Figure 5:
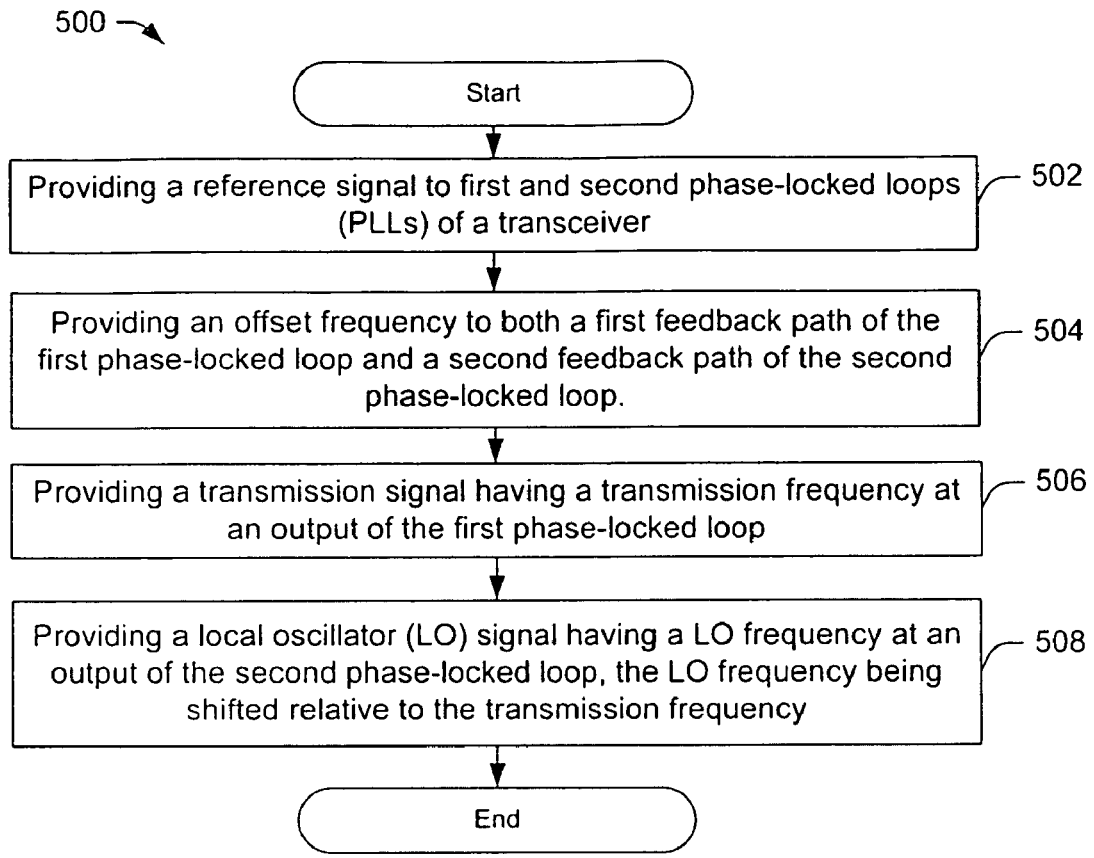
FIG. 5 shows a flowchart illustrating a method of signal processing according to another embodiment of the present invention.

Now that some examples of systems of heterodyne transceivers have been discussed, reference is made to FIGS. 4-5, which show methods in accordance with some aspects of the invention. FIG. 4 shows a somewhat general method 400, while FIG. 5 shows a more detailed method 500. While these methods are illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated act may be required to implement a methodology in accordance with one or more aspects of the present invention. Further, one or more of the acts depicted herein may be carried out in one or more separate acts or phases.

Referring now to FIG. 4, one can see the somewhat general method 400 for signal processing in a transceiver. The method 400 starts at 402 when a transmission signal having a transmission frequency is provided at an output of a first phase-locked loop of the transceiver. At 404, a local oscillator (LO) signal having a LO frequency is provided at an output of a second phase-locked loop of the transceiver. The LO frequency is shifted relative to the transmission frequency.

FIG. 5's method 500 starts at 502, when a reference signal is provided to first and second PLLs of a transceiver.

At 504, an offset frequency is provided to both a first feedback path of the first PLL and a second feedback path of the second PLL.

At 506, a transmission signal having a transmission frequency is provided at the output of the first PLL. The transmission signal is based on both the reference signal and a first correction signal, which is provided on the first feedback path.

At 508, a LO signal having an LO frequency is provided at the output of the second PLL. The LO signal is based on both the reference signal and a second correction signal, which is provided on the second feedback path. The frequency of the LO signal is frequency shifted relative to that of the reference signal.

Figure 6:
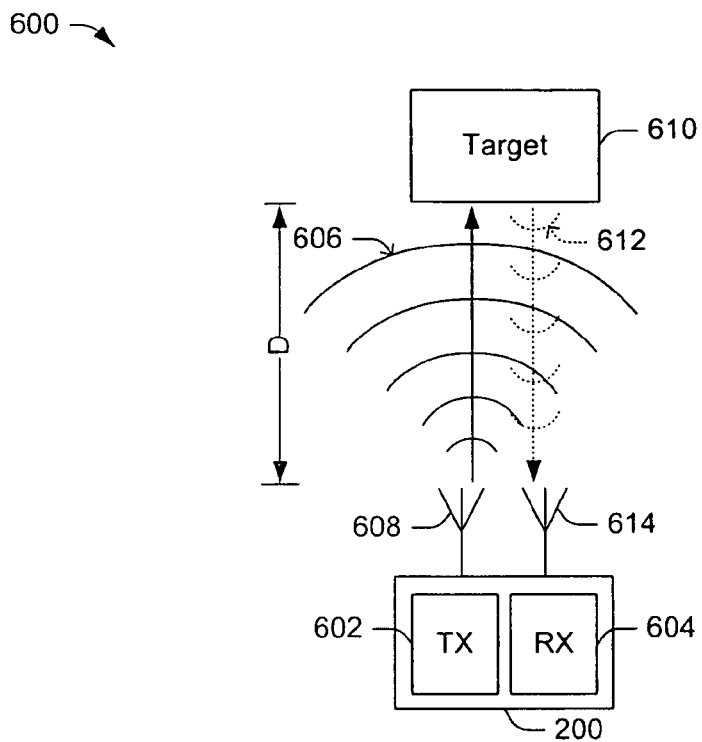
FIGS. 6-7 show a radar system that includes a heterodyne transceiver.

Some applications of the present invention are applicable to Doppler, pulsed, frequency modulated continuous wave (FMCW), frequency-stepped continuous wave (FSCW), and/or other types of radar systems. FIG. 6 shows one embodiment of a FMCW radar system 600 that includes heterodyne transceiver 200 as previously discussed. A transmitter portion 602 of the transceiver 200 sends a transmitted signal 606, such as a radio wave or other electromagnetic wave, over a transmit antenna 608 towards a target 610. Similarly, a receiver portion 604 of the transceiver 200 receives a scattered signal 612 via a receive antenna 614, where the scattered signal 612 is reflected from the target 610.

Figure 7:
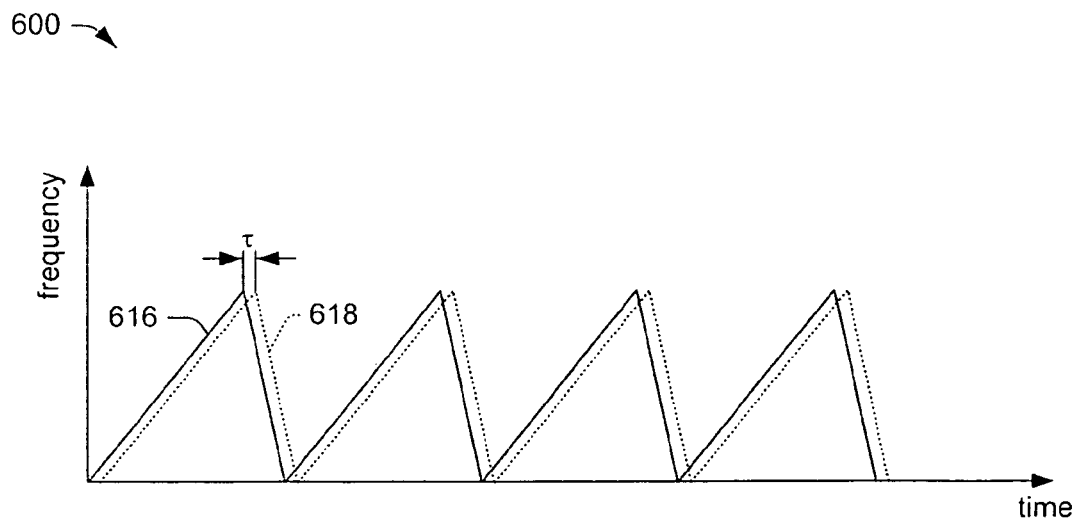

To determine a distance D to the target 610, the transmitter 602 sends the transmitted signal 606 as a frequency ramp 616 whose frequency varies as a function of time, for example, as shown in FIG. 7. After the transmitted signal 606 is sent, there is some delay, $\tau$, before the scattered signal 612 is received as a delayed frequency ramp 618 back at the receiver 604. Because the transmitted and scattered signals 606, 612 travel a total distance of 2D at the speed of light, c; the delay, $\tau$, will be directly proportional to the distance, D, to the target 610 (i.e., $\tau=2D/c$). Thus, by measuring the delay, $\tau$, between the transmitted and scattered signals 606, 612, the radar system 600 can monitor the distance to the target 610. Even though FIGS. 6-7 show one example of how a heterodyne transceiver could be used in a radar system, the present invention can also be used in many other types of communication systems (e.g., cell phones, personal digital assistants (PDAs), walkie-talkies).

Some methods and corresponding features of the present disclosure can be performed by hardware modules, software routines, or a combination of hardware and software. To the extent that software is employed, the software may be provided via a "computer readable medium", which includes any medium that participates in providing instructions to the processor. Such a computer readable medium may take numerous forms, including but not limited to, non-volatile media, volatile media, and transmission media. Non-volatile media includes, for example, optical disks (such as CDs, DVDs, etc.) or magnetic disks (such as floppy disks, tapes, etc.). Volatile media includes dynamic memory, such as ferroelectric memory, SRAM, or DRAM. Transmission media includes coaxial cables, copper wire, fiber optics, etc. that could deliver the instructions over a network or between communication devices. Transmission media can also include electromagnetic waves, such as a voltage wave, light wave, or radio wave.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transceiver, comprising:
   a first phase-locked loop adapted to receive a reference signal and output a transmission signal that is based on the reference signal, wherein the first phase-locked loop comprises:
   a first phase frequency detector adapted to generate a first tuning signal based on both the reference signal and a first correction signal;
   a first variable electronic oscillator adapted to generate the transmission signal based on the first tuning signal; and
   a first feedback path adapted to generate the first correction signal based on the transmission signal;
   a second phase-locked loop adapted to receive the reference signal and output a local oscillator (LO) signal that is based on the reference signal, the frequency of the LO signal being shifted relative to the frequency of the transmission signal, wherein the second phase-locked loop comprises:
   a second phase frequency detector adapted to generate a second tuning signal based on both the reference signal and a second correction signal;
   a second variable electronic oscillator adapted to generate the LO signal based on the second tuning signal; and
   a second feedback path adapted to generate the second correction signal based on the LO signal,
   wherein the first and second feedback paths comprise first and second mixers, respectively, adapted to receive a common offset frequency.

2. The transceiver of claim 1, further comprising:
   a receive mixer adapted to down-convert a radio frequency (RF) signal to an intermediate frequency (IF) signal based on the LO signal.

3. The transceiver of claim 2, further comprising:
   a transmit antenna adapted to transmit the transmission signal; and
   a receive antenna adapted to receive the RF signal.

4. The transceiver of claim 2, further comprising:
   a diplexer adapted to provide the transmission signal to an antenna and adapted to receive the RF signal from the antenna.

5. The transceiver of claim 1, wherein the first and second feedback paths comprise first and second frequency dividers, respectively.

6. The transceiver of claim 5, where the first and second frequency dividers have different values.

7. The transceiver of claim 5, where the first and second frequency dividers have a common value.

8. A transceiver, comprising:
   a first phase-locked loop that includes a first feedback path, the first phase-locked loop adapted to receive a first reference signal and output a transmission signal that is based on the first reference signal;
   a second phase-locked loop that includes a second feedback path, the second phase-locked loop adapted to receive a second reference signal and output a local oscillator (LO) signal that is based on the second reference signal, the frequency of the LO signal being shifted relative to the frequency of the transmission signal,
   wherein the first and second feedback paths comprise first and second mixers, respectively, adapted to receive a common offset frequency.

9. The transceiver of claim 8, where the first and second feedback paths further comprise first and second frequency dividers, respectively.

10. The transceiver of claim 9, where the first and second frequency dividers are arranged to cooperative shift the frequency of the LO signal relative to the frequency of the transmission signal.

11. The transceiver of claim 8, where the first and second reference signals are approximately equal.

12. The transceiver of claim 8, where the first and second feedback paths vary from one another to facilitate establishment of the frequency shift.

13. A method of signal processing in a transceiver, comprising:
    providing a transmission signal having a transmission frequency at an output of a first phase-locked loop of the transceiver;
    providing a local oscillator (LO) signal having a LO frequency at an output of a second phase-locked loop of the transceiver, the LO frequency being shifted relative to the transmission frequency; and
    providing an offset frequency to both a first feedback path of the first phase-locked loop and a second feedback path of the second phase-locked loop.

14. The method of claim 13, where the LO frequency is less than the transmission frequency.

15. The method of claim 13, where the LO frequency is greater than the transmission frequency.

16. The method of claim 13, further comprising:
    providing a reference signal to both the first and second phase-locked loops.

17. The method of claim 13, further comprising:
    frequency dividing by a first amount on the first feedback path; and
    frequency dividing by a second, different amount on the second feedback path.

* * * * *